United States Patent
Watanabe et al.

(10) Patent No.: US 8,933,558 B2
(45) Date of Patent: Jan. 13, 2015

(54) SEMICONDUCTOR PACKAGE, WIRING BOARD UNIT, AND ELECTRONIC APPARATUS

(75) Inventors: Manabu Watanabe, Yokohama (JP); Kenji Fukuzono, Kawasaki (JP)

(73) Assignee: Fujitsu Limited, Kawsaki (JP)

( * ) Notice: Subject to any disclaimer, the term of this patent is extended or adjusted under 35 U.S.C. 154(b) by 230 days.

(21) Appl. No.: 13/593,733

(22) Filed: Aug. 24, 2012

(65) Prior Publication Data
US 2013/0083488 A1   Apr. 4, 2013

(30) Foreign Application Priority Data
Sep. 30, 2011   (JP) .................. 2011-218619

(51) Int. Cl.
*H01L 23/10*  (2006.01)
*H01L 23/34*  (2006.01)
*H01L 23/367*  (2006.01)
*H01L 23/40*  (2006.01)
*H01L 23/42*  (2006.01)

(52) U.S. Cl.
CPC ............ *H01L 23/10* (2013.01); *H01L 23/3675* (2013.01); *H01L 23/4006* (2013.01); *H01L 23/42* (2013.01); *H01L 2224/16225* (2013.01); *H01L 2224/32245* (2013.01); *H01L 2224/73253* (2013.01); *H01L 2924/15311* (2013.01); *H01L 2924/16251* (2013.01); *H01L 2924/19105* (2013.01); *H01L 2924/3511* (2013.01)
USPC ......................................... 257/707; 257/706

(58) Field of Classification Search
USPC ................... 257/706, 707, 712, 713, 718, 722
See application file for complete search history.

(56) References Cited

U.S. PATENT DOCUMENTS

| | | | | |
|---|---|---|---|---|
| 5,543,663 A | * | 8/1996 | Takubo | 257/720 |
| 5,604,978 A | * | 2/1997 | Sherif et al. | 29/840 |
| 5,623,394 A | * | 4/1997 | Sherif et al. | 361/705 |
| 5,931,222 A | * | 8/1999 | Toy et al. | 165/80.3 |
| 6,362,516 B1 | * | 3/2002 | Waters | 257/678 |
| 2010/0226102 A1 | | 9/2010 | So et al. | |

FOREIGN PATENT DOCUMENTS

| | | |
|---|---|---|
| JP | 2003-060132 A | 2/2003 |
| JP | 2005-012127 A | 1/2005 |
| JP | 2010-205919 A | 9/2010 |

* cited by examiner

*Primary Examiner* — S. V. Clark
(74) *Attorney, Agent, or Firm* — Squire Patton Boggs (US) LLP

(57) ABSTRACT

A semiconductor package which is allocated between a wiring board and a cooling member, the semiconductor package, includes: a package board; a heating element which is mounted on the package board; a chip part which is mounted on the package board and provided around the heating element; and a heat transfer element having a main body unit which is jointed to the heating element with a metal joint material and a leg part which extends from the main body part to the package board and of which a tip is attached to the package board, and wherein the leg part, comprising: a first leg part allocated in a corner of the package board; and a second leg part which is allocated inside the first leg part between the heating element and the chip part on the package board.

10 Claims, 18 Drawing Sheets

SEMICONDUCTOR PACKAGE, WIRING BOARD UNIT, AND ELECTRONIC APPARATUS

CROSS-REFERENCE TO RELATED APPLICATION

This application is based upon and claims the benefit of priority from the prior Japanese Patent Application No. 2011-218619, filed on Sep. 30, 2011, the entire contents of which are incorporated herein by reference.

FIELD

The embodiments discussed herein are related to a semiconductor package, a wiring board unit, and an electronic apparatus.

BACKGROUND

In recent years, there has been a trend that the heating amount of a semiconductor chip increases as the function and the speed performance of a Central Processing Unit (CPU) and the like in an electronic apparatus have been advanced. In most cases, the semiconductor chip is not mounted on a large system board. In general, the semiconductor chip is mounted on a small board called a package board. A package board on which a semiconductor chip is mounted is called a semiconductor package. The semiconductor package is mounted on, for example, a print wiring board that is called a system board or mother board.

When the semiconductor package is mounted on the print wiring board in the above-described manner, a heat radiation mechanism such as a heat sink is mounted on the semiconductor package so that the heat from the semiconductor chip is released into the air. In this case, a heat spreader that touches the surface of the semiconductor chip is provided in the semiconductor package. In this manner, there is a proposed technique for effectively transferring the heat of the semiconductor chip to the heat sink by allocating the heat spreader between the semiconductor chip and the heat sink. The heat spreader includes a leg part extending toward the package board. The tip of the leg part is bonded to the package board using adhesion bond such as a resin, for example.

Regarding the above-described semiconductor package, the semiconductor chip may be jointed to the heat spreader with a joint material. For example, a metal joint material such as solder is used as the joint material used to joint the semiconductor chip to the heat spreader.

The followings are reference documents.
[Document 1] Japanese Laid-open Patent Publication No. 2010-205919
[Document 2] Japanese Laid-open Patent Publication No. 2005-12127
[Document 3] Japanese Laid-open Patent Publication No. 2003-60132

SUMMARY

According to an aspect of the invention, a semiconductor package which is allocated between a wiring board and a cooling member, the semiconductor package, includes: a package board; a heating element which is mounted on the package board; a chip part which is mounted on the package board and provided around the heating element; and a heat transfer element having a main body unit which is jointed to the heating element with a metal joint material and a leg part which extends from the main body part to the package board and of which a tip is attached to the package board, and wherein the leg part, comprising: a first leg part allocated in a corner of the package board; and a second leg part which is allocated inside the first leg part between the heating element and the chip part on the package board.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

[Comparison Example]

Figure 1:
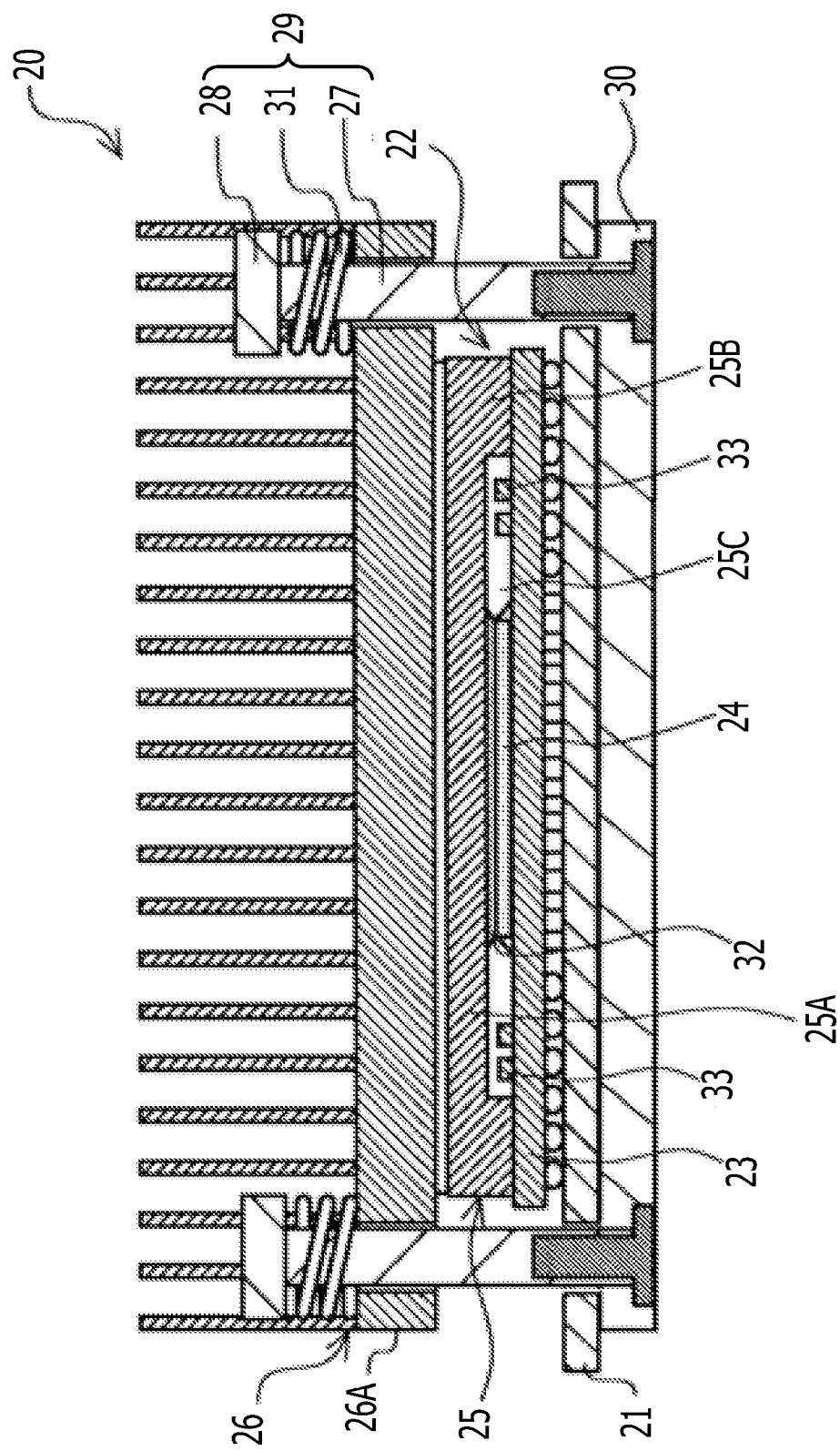
FIG. 1 is a cross-section diagram of a wiring board unit according to a first mode of a comparison example.

FIG. 1 is a cross-section diagram of a wiring board unit 20 according to a first mode of a comparison example. The wiring board unit 20 includes a main board 21 as a print wiring board. For example, a resin board is used as the main board 21. A semiconductor package 22 such as an LSI, a CPU, or the like is mounted on the surface of the main board 121 by a Ball Grid Array (BGA) mounting method, for example.

Figure 2:
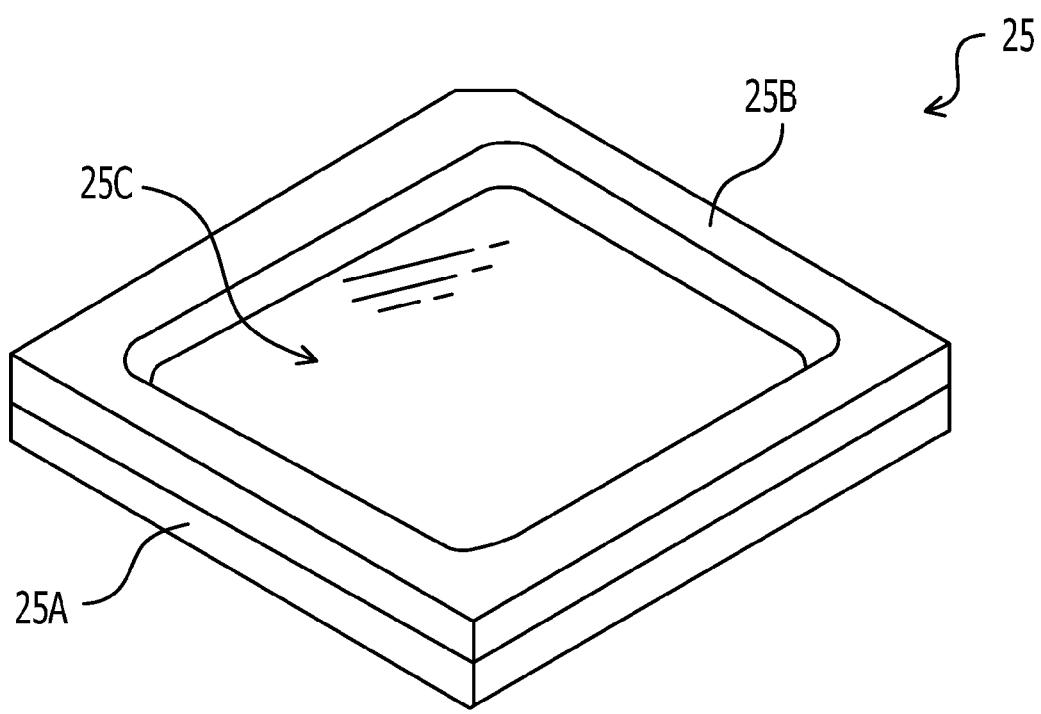
FIG. 2 is an appearance perspective diagram of a heat spreader viewed from underneath according to the first mode of the comparison example.

The semiconductor package 22 includes, for example, a package board 23 using a resin board, a semiconductor chip 24 mounted on the package board 23, and a heat spreader 25. The heat spreader 25 has a function as a lid used to cover the semiconductor chip 24 and a function as a heat transmission member. FIG. 2 is an appearance perspective diagram of the spread heater 25 viewed from underneath according to the first mode of the comparison example. A heat sink 26 as a heat release member is allocated on the upper surface of the heat spreader 25. The heat sink 26 is fixed to the main board 21 by a fastening member 29 that includes a bolt 27, a nut 28, and the like in such a way that the heat sink 26 is pressed against the upper surface of the heat spreader 25 concerning the semiconductor package 22.

The heat spreader 25 includes a main body unit 25A allocated in the upper part of the semiconductor chip 24, a leg part 25B extending from the main body unit 25A to the package board 23, and a storage concave portion 25C that stores the semiconductor chip 24. The tip surface of the leg part 25B is bonded to the package board 23 with a thermosetting resin, for example.

A base plate 26A of the heat sink 26 has an outline extending outside the heat spreader 25. For example, a heat conduction material such as a heat conduction sheet is sandwiched between the heat spreader 25 and the base plate 26A. Through holes through which the bolt 27 of the fastening member 29 is inserted are provided in four corners of the base plate 26A. One edge of the bolt 27 is coupled to a bolster plate 30 allocated on the back surface of the main board 21. The other edge of the bolt 27 is attached to the nut 28 and a spring 31. The spring 31 is compressed by fastening the nut 28. If the base plate 26A is pressed against the heat spreader 25 by a restoring force of the spring 31, the fixation degree of the heat sink 26 and the semiconductor package 22 corresponding to the main board 21 is increased.

Figure 3:
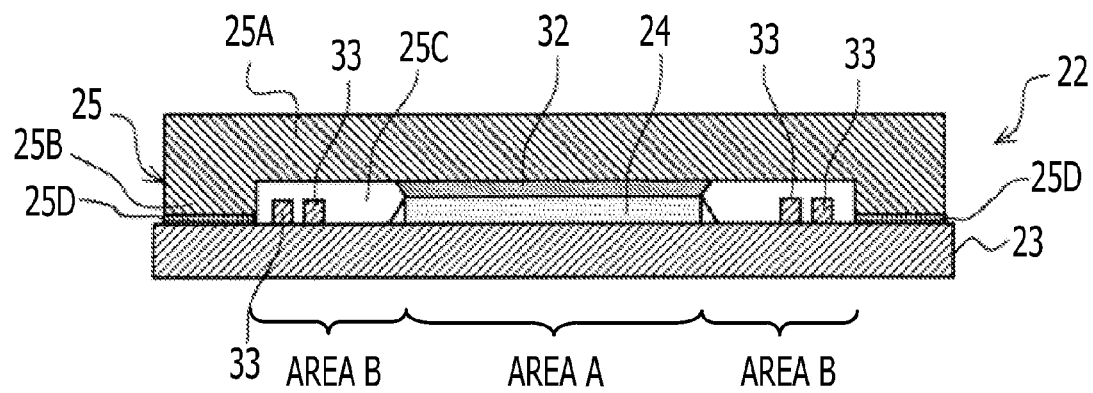
FIG. 3 is a diagram illustrating a joint procedure of a semiconductor package according to the first mode of the comparison example.

The semiconductor chip 24 is jointed to the heat spreader 25 with a metal joint material 32 such as solder. A chip part 33 is mounted around the semiconductor chip 24 on the surface of the package board 23. FIG. 3 is a diagram illustrating the joint procedure for jointing the semiconductor chip 24 to the heat spreader 25 with the metal joint material 32 and jointing the heat spreader 25 to the package board 23 with a thermosetting resin 25D at a time of manufacture of the semiconductor package 22. In the joint procedure, for example, while the semiconductor package 22 is heated up, the heat spreader 25 and the package board 23 are pressed to sandwich the thermosetting resin 25D in such a way that the temperature is equal to or higher than the melting point of the metal joint material 32 and is equal to or higher than the curing temperature at which the thermosetting resin 25D goes solid. As a result, since the thermosetting resin 25D goes solid, the tip surface of the leg part 25B in the heat spreader 25 is bonded (attached) to the surface of the package board 23. When the melted metal joint material 32 goes solid as the heat is removed, the semiconductor chip 24 is jointed to the heat spreader 25.

The package board 23 as a resin board is expanded in the heating process in the joint procedure and is then shrunk in the heat removing process. The semiconductor chip 24 is made of silicon, for example, as a material. The heat expansion rate of the semiconductor chip 24 is relatively smaller than the heat expansion rate of the resin board. Therefore, compared to the package board 23, the degree of expansion and shrinkage of the semiconductor chip 24 in the joint procedure is significantly reduced. That is, in the package board 23, a constrained condition of the package board 23 differs from an area A where the semiconductor chip 24 is mounted in the upper part and an area B sandwiched between the area A and the leg part.

Figure 4:
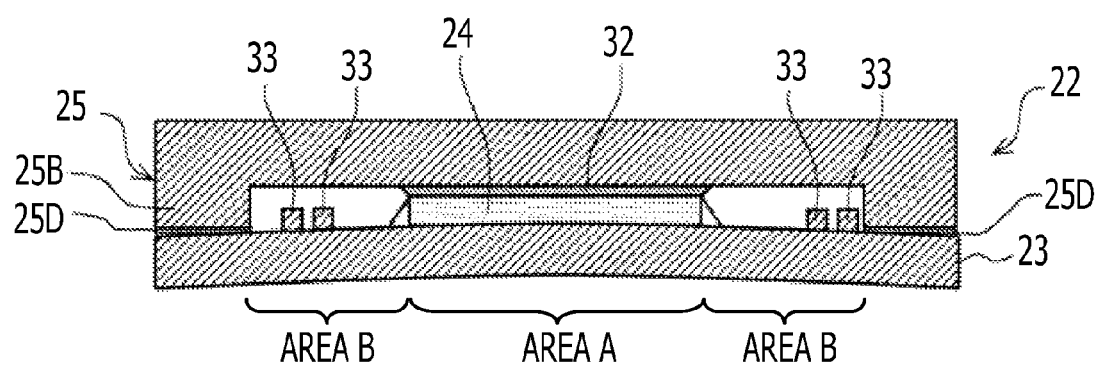
FIG. 4 is a diagram systematically illustrating a deformation of the package board according to the first mode of the comparison example in a heat removing process in the joint procedure.

FIG. 4 is a diagram systematically illustrating a deformation of the package board 23 according to the first mode of the comparison example in the heat removing process in the joint procedure. In the heat removing process in the joint procedure, the package board 23 is shrunk with decreasing temperature. At this time, since the upper surface of the package board 23 in the area A is constrained by a semiconductor chip with a small expansion rate, the shrink deformation amount is smaller compared to the lower surface. As a result, the upper surface is warped to be concave in the entire plane surface of the package board 23. In this state, when the metal joint material 32 goes solid (concrete), the upper surface of the semiconductor chip 24 is jointed to the heat spreader 25 in a state where the package board 23 is warped.

If the wiring board unit 20 according to the first mode is embedded in an electronic apparatus, the heat generation and the heat generation termination of the semiconductor chip 24 are repeated every time the power is turned off and on, so that the heating amount concerning the semiconductor chip 24 varies. Therefore, the temperature of the semiconductor chip 24 varies. For example, the deformation in the direction in which the warpage of the package board 23 caused at a time of manufacture of the semiconductor package 22 is fixed to the original or in the direction in which the warpage is increased. As a result, the stress is applied to the metal joint material 32, so that the metal joint material 32 may be damaged. The damage of the metal joint material 32 includes a phenomenon in which the metal joint material 32 is removed from the surface of the semiconductor chip 24 or the heat spreader 25.

In the heat removing process in the joint procedure, even after the metal joint material 32 between the semiconductor chip 24 and the heat spreader 25 goes solid, shrinkage deformation of the package board 23 may be maintained. Regarding the heat spreader 25 according to the first mode, the leg part 25B is jointed to the periphery part of the package board 23. Therefore, if a large span is secured between the leg parts 25B, the presence area of the area B of the package board 23 is increased. Since the area B of the package board 23 is not constrained by the semiconductor chip 24, the shrinking deformation amount in the joint procedure is easily increased. As a result, the stress concentration is applied to the solid metal joint material 32, so that the metal joint material 32 may be damaged.

Figure 5:
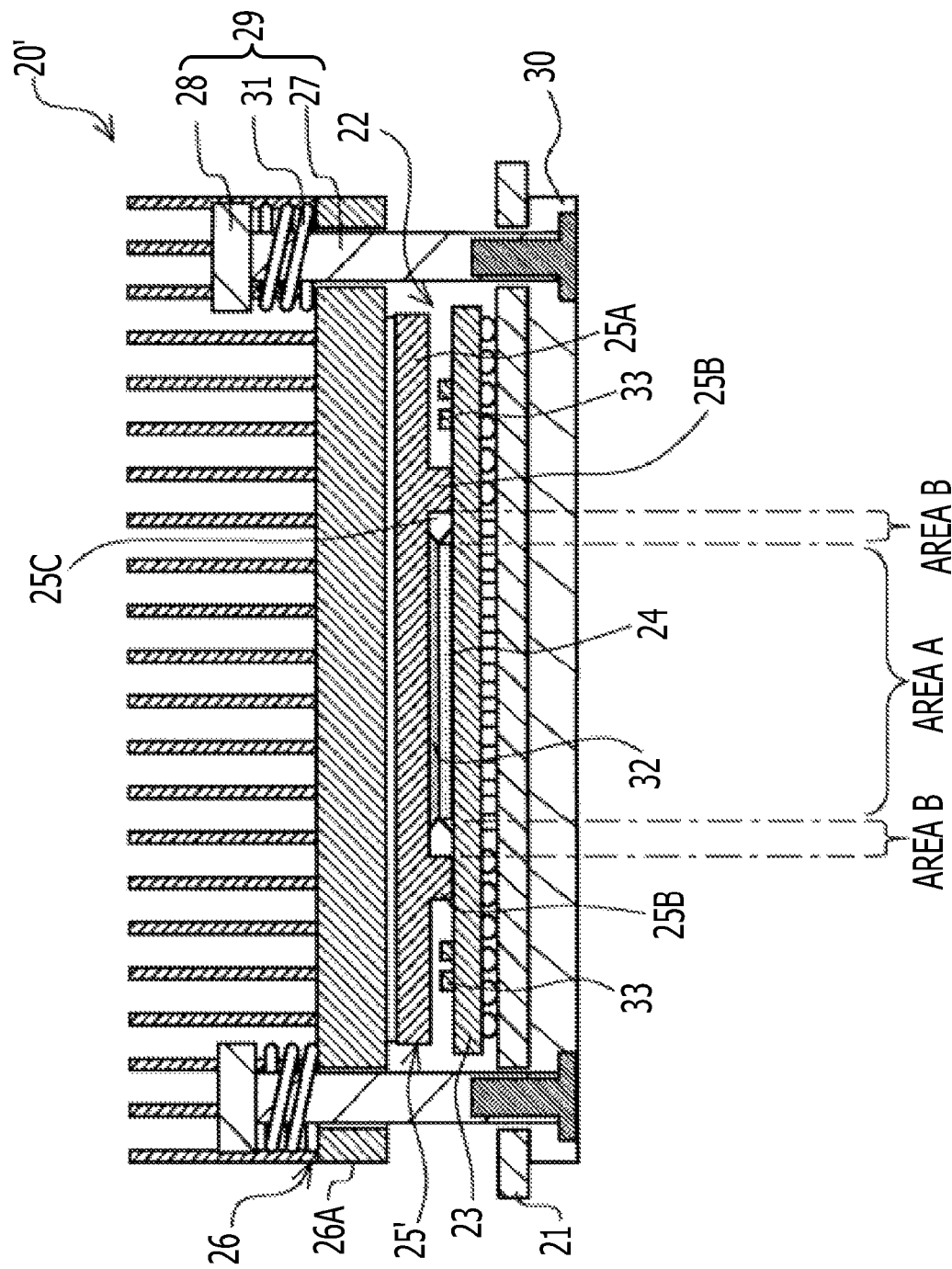
FIG. 5 is a cross-section diagram of a wiring board unit according to a second mode of the comparison example.
Figure 6:
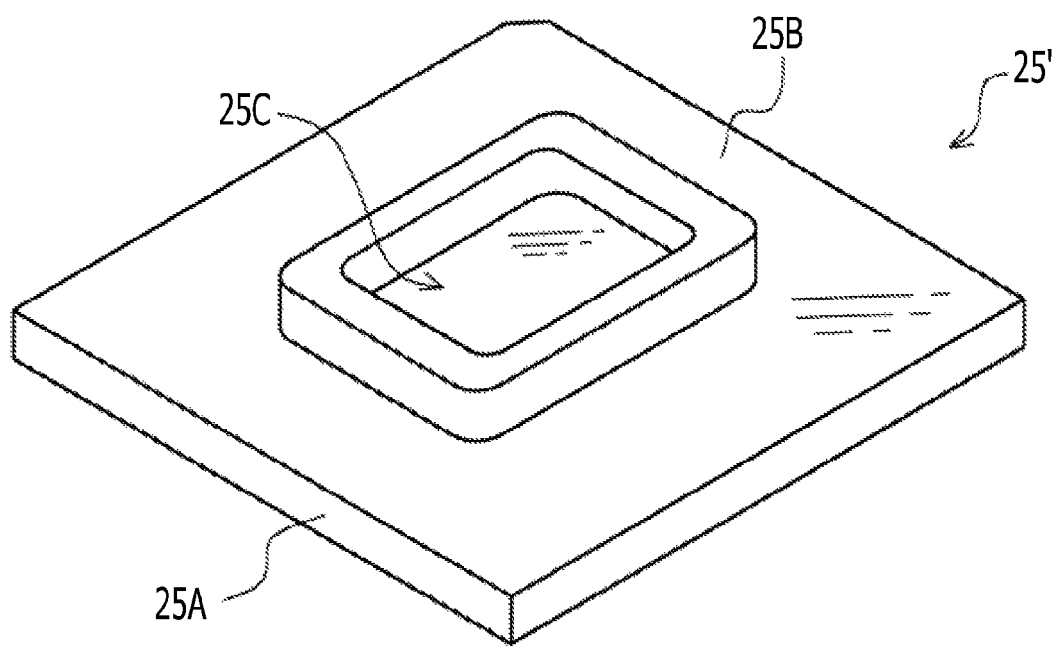
FIG. 6 is an appearance perspective diagram of the heat spreader viewed from underneath according to the second mode of the comparison example.

FIG. 5 is a cross-section diagram of a wiring board unit 20' according to a second mode of the comparison example. FIG. 6 is an appearance perspective diagram of a heat spreader 25' viewed from underneath according to the second mode of the comparison example. Compared to the heat spreader 25 according to the first mode, the span between the leg parts 25B is smaller in the heat spreader 25' according to the second mode. Accordingly, the area B in the package board 23 is smaller than the area B in the package board 23 according to the first mode (see FIG. 3). Therefore, the stress concentration on the metal joint material 32 is expected to be reduced in the heat removing process in the joint procedure.

However, regarding the heat spreader 25' according to the second mode, the main body unit 25A is projected toward the outside of the leg part 25B. Regarding a so-called cantilever type heat spreader 25', the stress concentration is easily applied to the metal joint material 32 by fastening the fastening member 29 due to the following reason. That is, the through holes of the bolt 27 formed in the four corners of the base plate 26A in the heat sink 26 are positioned outside the outline of the semiconductor package 22. Therefore, the base plate 26A is bended by fastening the nut 28 of the fastening member 29. Accordingly, regarding the heat spreader 25', the projection of the main body unit 25A is pressed against the base plate 26A and is then bended downward. As a result, the main body unit 25A is deformed to be convex on the upper side as a whole of the heat spreader 25'.

Compared to the heat spreader 25 according to the first mode, the span between the leg parts 25B in the heat spreader 25' according to the second mode is smaller, so that the radius of curvature is decreased (tight) when the main body unit 25A is bended. As a result, regarding the heat spreader 25' according to the second mode, the stress concentration on the metal joint material 32 caused by fastening the fastening member 29 is easily caused. In this manner, if the semiconductor package 22 is embedded in the electronic apparatus in the state where the stress concentration is applied to the metal joint material 32, the temperature of the semiconductor chip 24 varies when the power is turned on and off. As a result, additional stress is applied to the metal joint material 32, so that the metal joint material 32 may be damaged.

With reference to the diagrams, an electronic apparatus with a semiconductor package, a weird board unit, and a wiring board unit according to the embodiments solving the above-described problems will be described below. The following structure of the embodiments is an example. The semiconductor package, the wiring board unit, and the electronic apparatus according to the embodiments are not limited to the example.

[First Embodiment]

Figure 7:
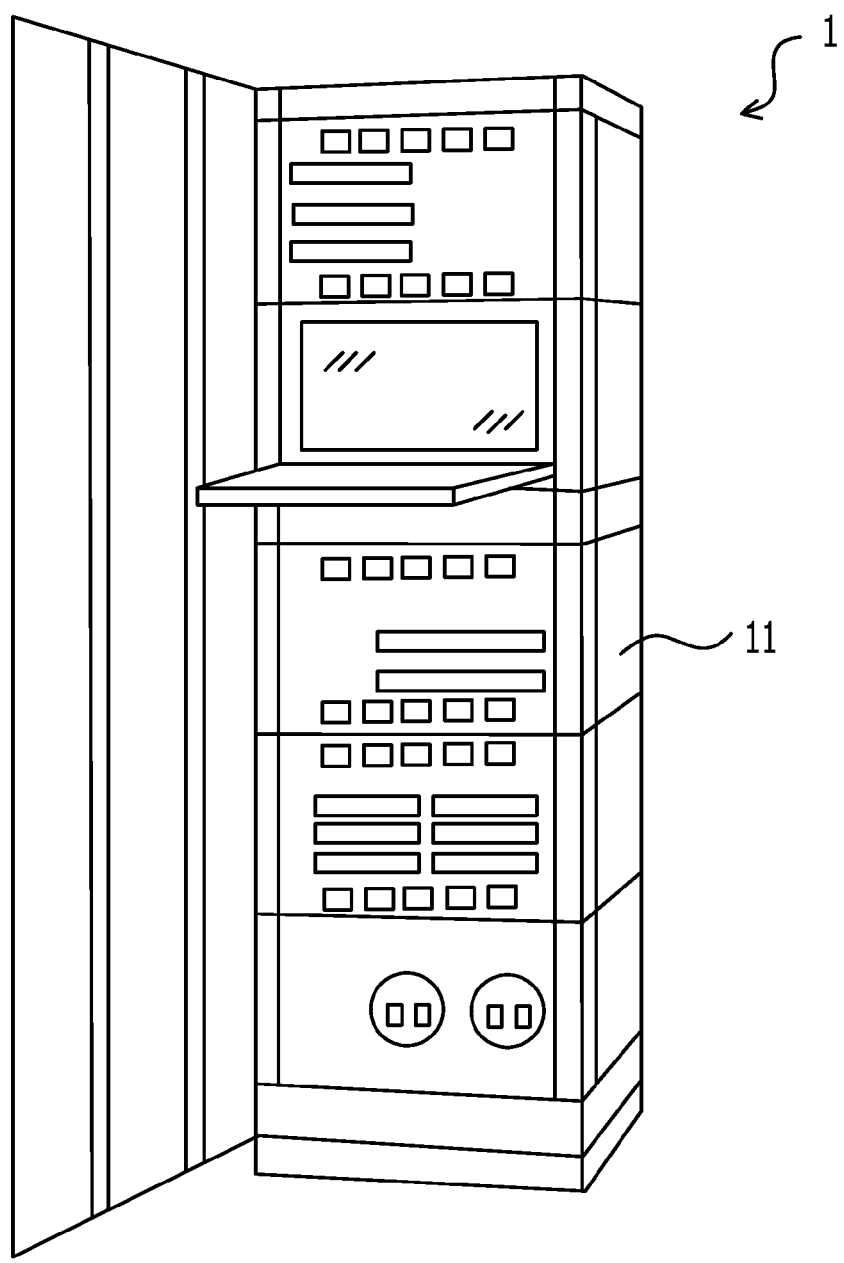
FIG. 7 is an appearance perspective diagram of an electronic apparatus according to a first embodiment.
Figure 8:
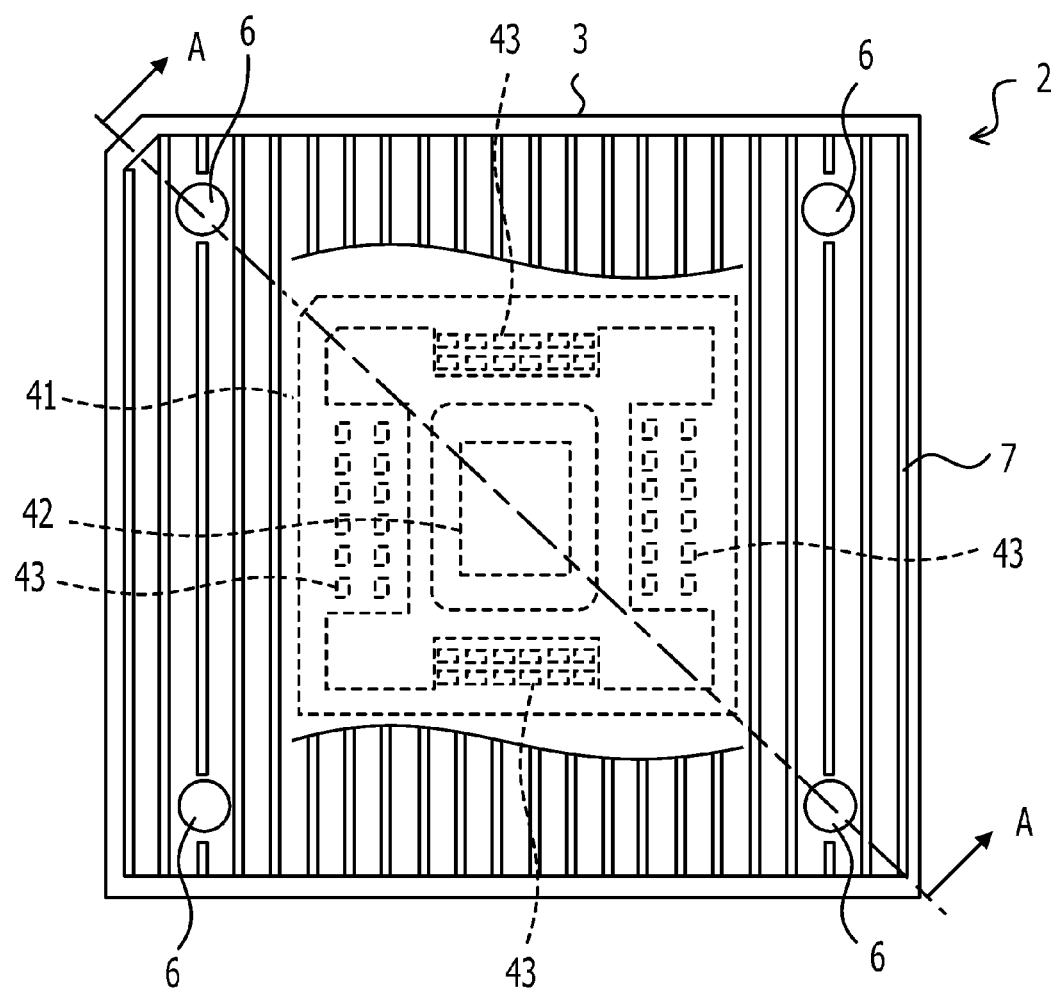
FIG. 8 is an upper surface diagram of the wiring board unit according to the first embodiment.
Figure 9:
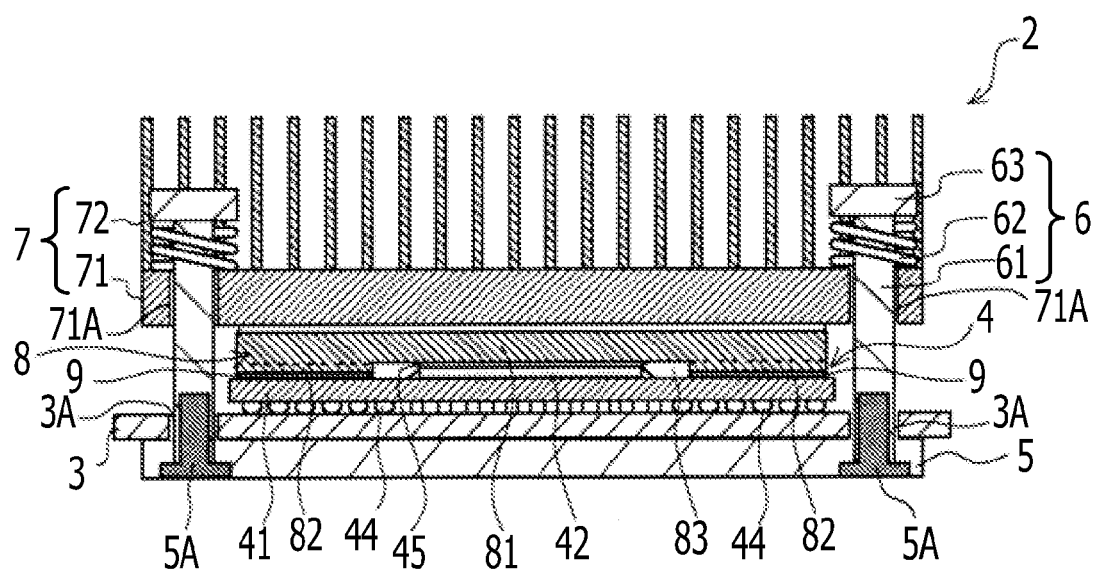
FIG. 9 is an A-A arrow cross-section diagram of FIG. 8.
Figure 10:
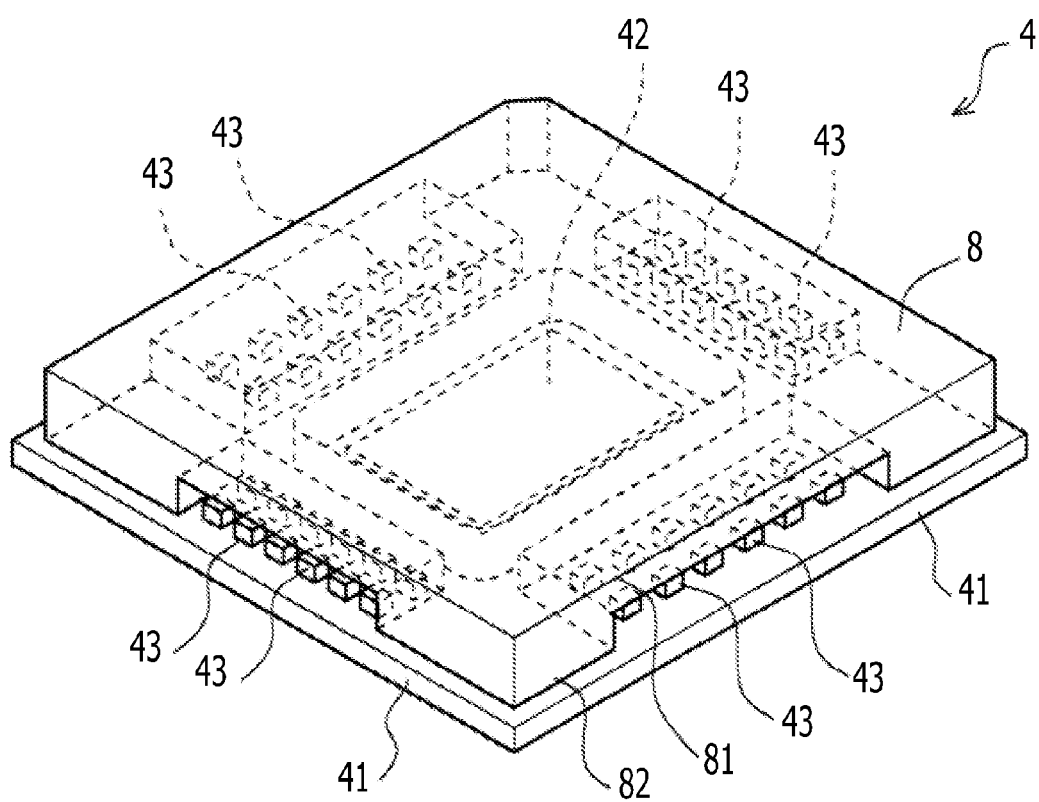
FIG. 10 is an appearance perspective diagram of the wiring board unit according to the first embodiment.

FIG. 7 is an apparatus perspective diagram of an electronic apparatus 1 according to a first embodiment. FIG. 8 is a diagram of an upper surface of a wiring board unit according to the first embodiment. FIG. 9 is an A-A arrow cross-section diagram of FIG. 8. FIG. 10 is an appearance perspective diagram of the wiring board unit according to the first embodiment.

The numeral 1 in FIG. 1 indicates the electronic apparatus 1 such as a server, a main frame, or the like, for example. The electronic apparatus 1 includes a housing 11. The housing 11 stores a wiring board unit 2 illustrated in FIGS. 8 and 9, and the like. The wiring board unit 2 includes a main board 3, a semiconductor package 4, a bolster plate 5, a fastening member 6, a heat sink 7, and the like. For example, a resin board is used as the main board 3. The semiconductor package 4 is mounted on the surface of the main board 3.

The semiconductor package 4 includes a package board 41, a semiconductor chip 42, a chip part 43, a heat spreader 8, and the like. The structure for coupling the semiconductor package 4 to the main board 3 employs, a Ball Grid Array (BGA) mounting method, for example. The package board 41 has an outline shaped like a rectangle. The package board 41 is formed with a glass epoxy multilayer board, for example. A plurality of terminal bumps 44, that is, BGAs are allocated on the lower surface (back surface) of the package board 41. The semiconductor package 4 is electrically jointed to the surface (upper surface) of the main board 3 through the terminal bumps 44. For example, a solder ball may be used as the terminal bump 44. For example, lead-free solder using an alloy such as tin, silver, and copper is preferably applicable to the solder ball. The semiconductor chip 42 is given as an example of a heating element.

In addition to the semiconductor chip 42, the chip part 43 such as a chip capacitor or a chip resistor, for example, is mounted on the surface (upper surface) of the package board 41. The semiconductor chip 42 and the chip part 43 may be electrically coupled to the terminal of the package board 41 by a flip chip coupling or the like, for example.

The heat spreader 8 of the semiconductor package 4 has a function as a lid (cap) for covering the semiconductor chip 42 and a function for transferring the heat of the semiconductor chip 42 that generates heat in operation to the heat sink 7. The heat spreader 8 includes a main body unit 81 allocated in the upper part of the semiconductor chip 42, a leg part 82 extending (hanging) from the lower surface (back surface) of the main body unit 81 to the package board 41, and a storage concave portion 83 that stores the semiconductor chip 42. The tip surface of the leg part 82 is integrally bonded (jointed) to the package board 41 with the thermosetting resin 9. The adhesion bond used to bond the leg part 82 of the heat spreader 8 to the surface of the package board 41 is not limited to the thermosetting resin.

Regarding the storage concave portion 83, the existence area is drawn by the lower surface of the main body unit 81, the inner surface of the leg part 82, and the upper surface (front surface) of the package board 41. According to the present embodiment, the storage concave portion 83 is formed in a box shape. However, the shape of the storage concave portion 83 is not limited to a box shape, and other shapes may be employed. A metal material with high thermal conductivity such as copper and aluminum, for example, may be used as the heat spreader 8. The heat spreader 8 is an example of a heat transfer element.

The main body unit 81 of the heat spreader 8 is a part that mainly functions to transfer the heat of the semiconductor chip 42 to the heat sink 7. The main body unit 81 has an outline that is larger than the upper surface of the semiconductor chip 42 and transfers the heat, which is transferred from the semiconductor chip 42, to the heat sink 7 while distributing the heat in a plane surface direction of the main body unit 81. In recent years, the heating amount of the semiconductor chip 42 as a heating element has been increasing as the function and the speed performance of the CPU and the like in the electronic apparatus 1 have been advanced. The upper surface of the semiconductor chip 42 is thermally joined to the lower surface (back surface) of the main body unit 81 of the heat spreader 8 with a metal joint material 45 with low thermal resistance. Due to this, the heat conductivity from the semiconductor chip 42 to the heat spreader 8 is improved. According to the embodiment, the solder is used as an example of the metal joint material 45. The example is not limited to solder. The shape and function of the leg part 82 of the heat spreader 8 will be described below.

The joint procedure for jointing the semiconductor chip 42 to the heat spreader 8 with the metal joint material 45 and joining the heat spreader 8 to the package board 41 with the thermosetting resin 9 is similar to the procedures described in the above-described comparison example. In the joint procedure, for example, hot pressing processing is performed to sandwich the heat spreader 8 and the package board 41 while heating the semiconductor package 4 so that the temperature is equal to or higher than the melting point of the metal joint material 45 and is equal to or higher than the curing temperature at which the thermosetting resin 9 goes solid. In the hot pressing processing, for example, the solder as the metal joint material 45 is allocated between the lower surface of the main body unit 81 of the heat spreader 8 and the upper surface of the semiconductor chip 42. The thermosetting resin 9 is allocated and temporally fixed between the lower surface (tip surface) of the leg part 82 of the heat spreader 8 and the upper surface of the package board 41. The hot pressing processing is conducted on the semiconductor package 4 in the above-described state by a vacuum hot pressing apparatus, for example, under a predetermined heating condition and pressing condition.

As illustrated in FIGS. 8 and 9, the heat sink 7 includes a base plate 71 and a plurality of heat releasing fins 72. The base plate 71, which is a plate member expanding in the plane surface direction of the main board 3, is allocated in the upper part of the heat spreader 8. The base plate 71 has an outline expanding outside the main body unit 81 of the heat spreader 8. A heat conductive material such as a heat conduction sheet is sandwiched between the main body unit 81 of the heat spreader 8 and the base plate 71, so that the main body unit 81 and the base plate 71 thermally contact with each other.

The heat releasing fin 72 is a heat releasing plate shaped like a thin plate fixed to the base plate 71. Each of the heat releasing fins 72 is provided to stand up in the vertical direction from the upper surface of the base plate 71. The heat releasing fins 72 are arranged in a parallel to each other. Gas passages extending in the similar direction are formed between the adjacent heat releasing fins 72. For example, a metal member such as aluminum and copper may be used for the base plate 71, the heat releasing fin 72, and the like.

In this manner, the semiconductor package 4 is allocated between the main board 3 and the heat sink 7, the semiconductor chip 42 and the heat spreader 8 are provided to thermally contact with each other, and the heat spreader 8 and the heat sink 7 are provided to thermally contact with each other. The heat of the semiconductor chip 42 is transferred to the heat sink 7 through the metal joint material 45 and the heat spreader 8. The heat transferred to the base plate 71 of the heat sink 7 is released into the air from the heat releasing fins 72.

The fastening members 6 are allocated in four corners of the base plate 71 in the heat sink 7. The fastening member 6 is a member that fixes the heat sink 7 to the main board 3 while pressing the heat sink 7 against the upper surface of the semiconductor package 4, that is, the heat spreader 8. The fastening member 6 includes a bolt 61, a spring 62, and a nut 63. The fastening member 6 is allocated outside the allocation area in the semiconductor package 4. A through hole 71A through which the bolt 61 is inserted is allocated in each of the four corners of the base plate 71 of the heat sink 7. The bolster plate 5 that is used to fix the fastening member 6 is allocated on the lower surface (back surface) of the main board 3 (see FIG. 9). For example, the base edge side of the bolt 61 is integrally fixed to the bolster plate 5 through a fixture 5A such as a drive screw, for example.

As with the base plate 71, the main board 3 includes the through hole 3A through which the bolt 61 is inserted. The main board 3 includes four through holes 3A in the positions corresponding to the through holes 71A provided in the base plate 71. For example, the bolt 61 is sequentially inserted, from the back surface of the main board 3, through the through hole 3A and the through hole 71A provided to be matched with each other in the vertical direction. As illustrated in FIG. 9, the tip of the bolt 61, which is inserted through the through hole 3A and the through hole 71A, is projected from the upper surface of the base plate 71, and the spring 62 and the nut 63 are attached to the tip of the bolt 61.

By fastening the nut 63, the spring 62 is compressed. As a result, by the restoring force of the pressed spring 62, pressing force is applied to the base plate 71 and the bolster plate 5 from the spring 62 in a direction in which the space between the base plate 71 and the bolster plate 5 is narrowed. Due to this, the base plate 71 of the heat sink 7 is pressed against the upper surface of the heat spreader, so that the heat sink 7 and the semiconductor package 4 are fixed to the main board 3.

The bolster plate 5 is an example of a first plate. The base plate 71 is an example of a second plate. The heat sink 7 is an example of a cooling member. According to the embodiment, a cooling type heat sink 7 is employed as an example of the cooling member that cools the semiconductor package 4. Other mechanisms are applicable to the first embodiment. For example, so-called liquid cooling mechanism having a passage, through which cooled liquid is circulated in the base plate 71, is applicable.

Figure 11:
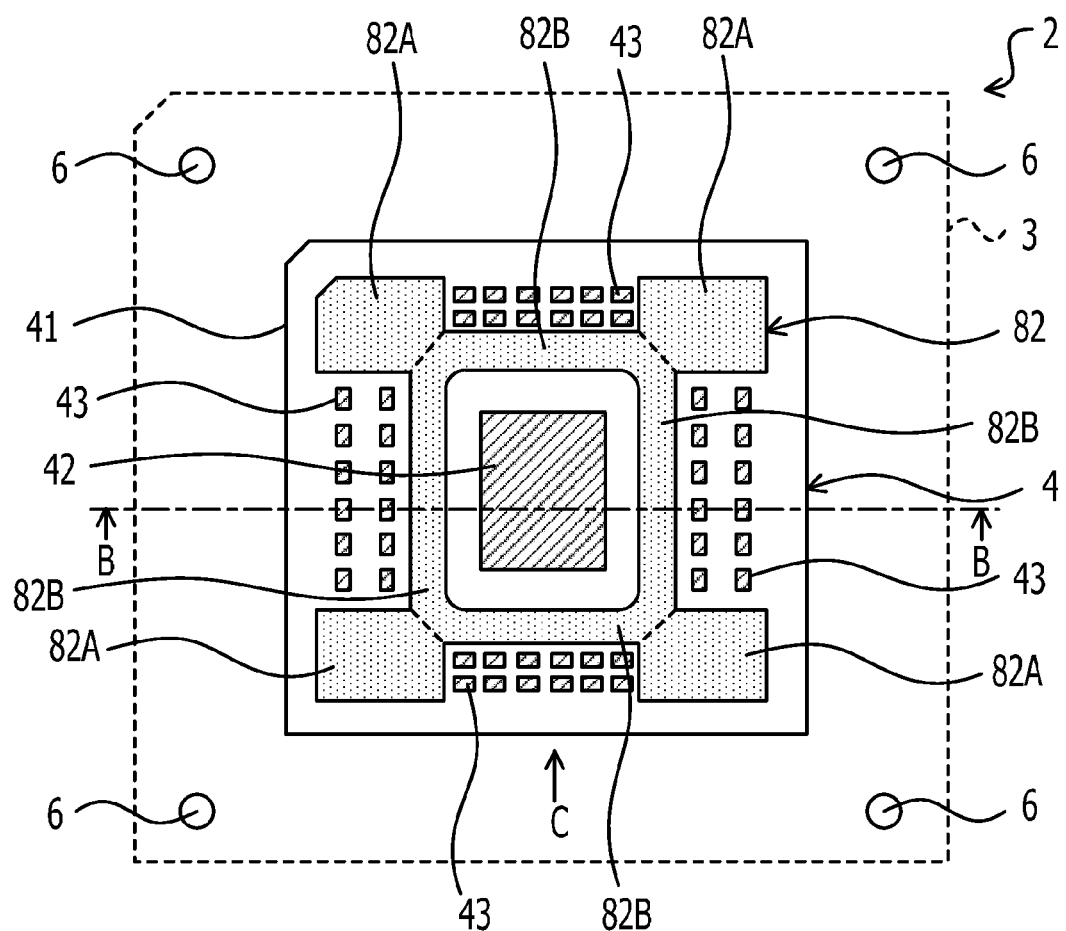
FIG. 11 is a horizontal cross-section diagram of the wiring board unit according to the first embodiment.
Figure 12:
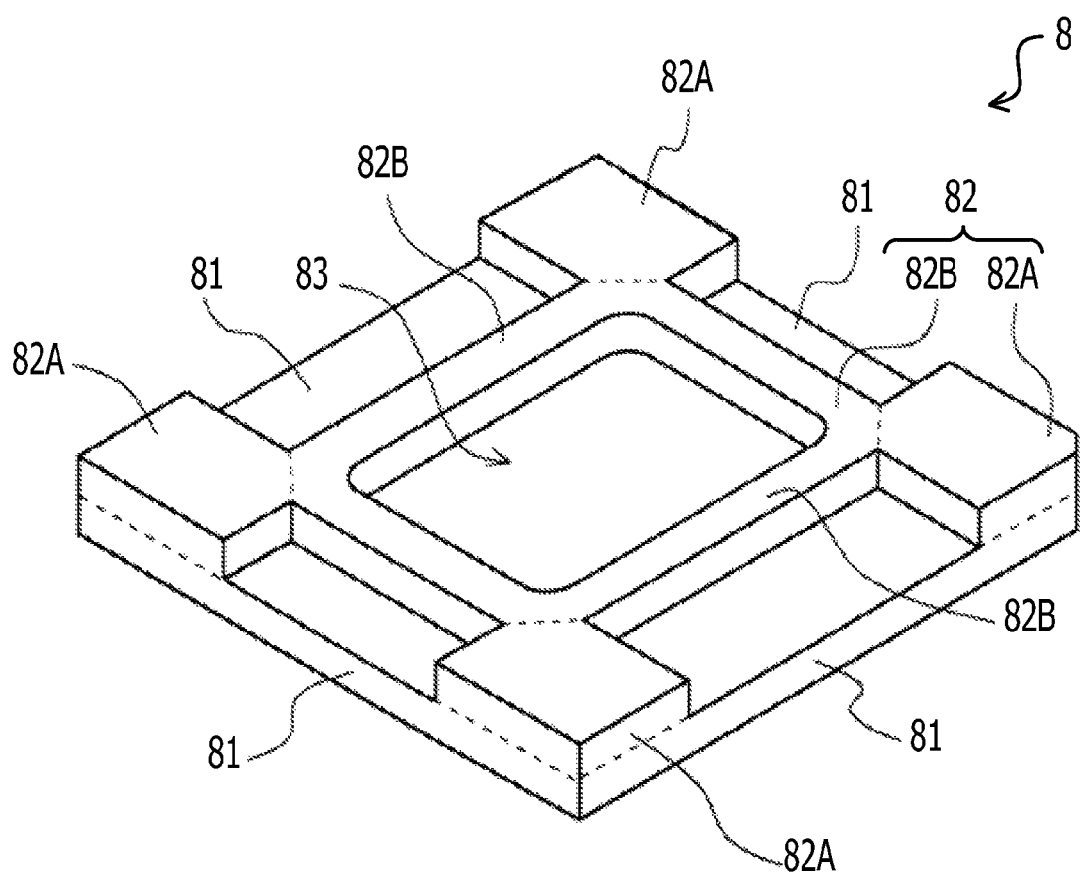
FIG. 12 is an appearance perspective diagram of the heat spreader viewed from underneath according to the first embodiment.
Figure 13:
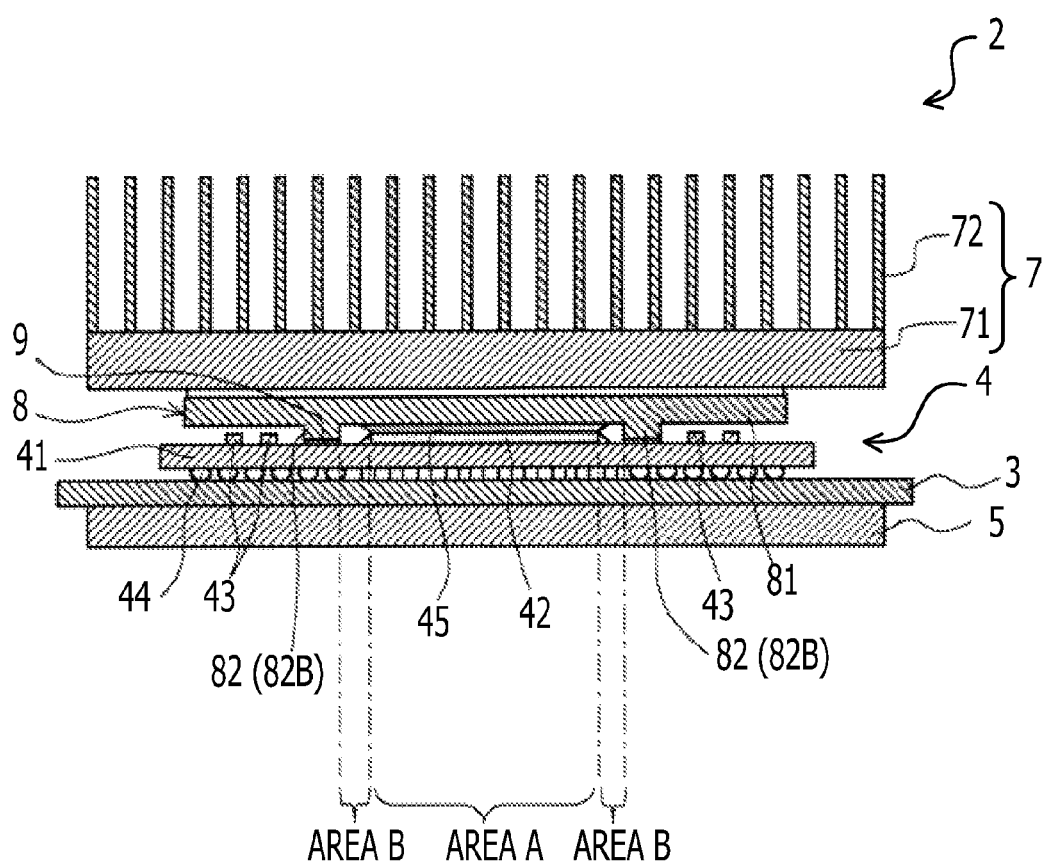
FIG. 13 is a B-B arrow cross-section diagram of FIG. 11.
Figure 14:
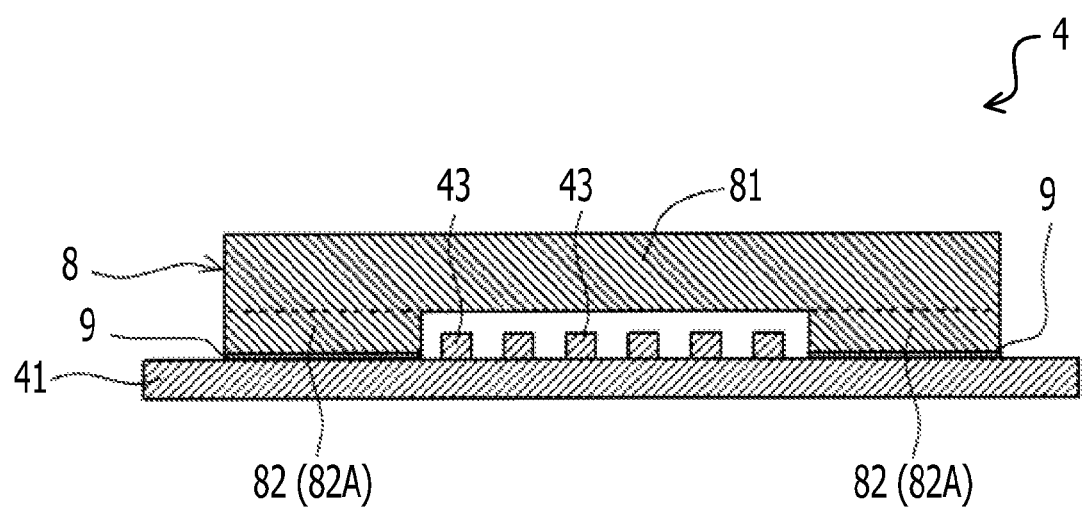
FIG. 14 is a side surface diagram of the semiconductor package according to the first embodiment.

The details of the structure of the heat spreader 8 will be described below. FIG. 11 is a horizontal cross-section diagram of the wiring board unit 2 according to the first embodiment. FIG. 11 illustrates a cross-section view obtained by cutting the semiconductor package 4 at the height of the leg part 82 of the heat spreader 8, the semiconductor chip 42, the chip part 43, and the like. In FIG. 11, the outline position of the main board 3 is indicated with a dashed line. FIG. 12 is an appearance perspective diagram of the heat spreader 8 viewed from underneath (that is, the storage concave portion 83 side) according to the first embodiment. FIG. 13 is a B-B arrow cross-section diagram of FIG. 11. FIG. 14 is a side surface diagram of the semiconductor package 4 according to the first embodiment. In FIG. 14, the illustration of the structure other than the semiconductor package 4 is omitted. FIG. 14 is a side surface diagram of the semiconductor package 4 viewed from the arrow C illustrated in FIG. 11. With reference to FIGS. 11 to 14, the details of the heat spreader 8 according to the embodiment will be described below.

The leg part 82 includes a first leg part 82A that is allocated in the corner of the package board 41 (one of the four corners in this case) and a second leg part 82B that is allocated inside the first leg part 82A, that is, in the part near the semiconductor chip 42. The first leg part 82A is provided between the semiconductor chip 42 and the fastening member 6. As illustrated in FIG. 11, for example, the first leg part 82A is allocated in any position on a virtual line connecting the corner of the semiconductor chip 42 and the fastening member 6. That is, the first leg part 82A is allocated in a plane surface position on the package board 41 sandwiched between the semiconductor chip 42 and the fastening member 6.

In this case, the chip part 43 is provided around the semiconductor chip 42 formed in a rectangular shape. More specifically, a plurality of chip parts 43 are provided along each side (side surface) of the semiconductor chip 42. The second leg part 82B of the heat spreader 8 is allocated inside the first leg part 82A in the package board 41 and between the chip part 43 and the semiconductor chip 42 provided around the semiconductor chip 42. Further, the second leg part 82B is formed in a circular shape when four liner wall bodies along the sides of the semiconductor chip 42 are coupled with each other. As illustrated in the deformation example described below, various changes may be added to the above-described shape and allocation mode of the first leg part 82A and the second leg part 82B.

Regarding the heat spreader 8 according to the embodiment, the second leg part 82B is allocated between the chip part 43 and the semiconductor chip 42 on the package board 41, so that the second leg part 82B is allocated near the semiconductor chip 42. As a result, compared to the wiring board unit 20 according to the first mode of the comparison example illustrated in FIG. 3, the range in which the area B is formed may be narrowed (see FIG. 13). More specifically, the range in which the area B is formed and is not constrained by the semiconductor chip 42, of which the shrinking deformation at the time of manufacture of the semiconductor package 4 is easily increased at the time of manufacture of the semiconductor package 4 (especially, the heat removing process in the joint procedure), may be narrowed. That is, the degree of warpage generated in the package board 41 is reduced at the time of manufacture of the semiconductor package 4. As a result, stress concentration on the metal joint material 45 is not easily caused after the metal joint material 45 goes solid, so that the metal joint material 45 is prevented from being damaged. Therefore, the reliability in the manufacture of the semiconductor package 4 may be prevented from decreasing.

At the time of the operation after the semiconductor package 4 is embedded in the electronic apparatus 1, as described above, the temperature of the semiconductor chip 42 varies every time the power is turned on and off. On the contrary, regarding the semiconductor package 4 according to the embodiment, the second leg part 82B of the heat spreader 8 is allocated near the semiconductor chip 42. In this case, the second leg part 82B exercises the function for holding a distance between the main body unit 81 and the package board 41.

Therefore, at the time of the operation of the semiconductor package 4, even if a heat expansion difference is generated between the semiconductor chip 42 and the heat spreader 8, the influence may be reduced. The second leg part 82B allocated near the semiconductor chip 42 holds the vertical distance between the main body unit 81 and the package board 41. This may prevent large stress from being applied to the metal joint material 45.

On the other hand, as described in the second mode of the comparison example, if simply the span between the leg parts 82 of the heat spreader 8 is reduced, the stress concentration on the metal joint material 45 is easily caused by fastening the fastening member 6. On the contrary, according to the embodiment, the first leg part 82A is allocated between the semiconductor chip 42 and the fastening member 6 in the corner of the package board 41 to which the fastening force of the fastening member 6 is applied. This solves the above-described problem.

In this case, in the plane surface of the main board 3, the fastening member 6 is allocated in the area, which is the outside of the outline of the package board 41, on the extended line connecting the opposing corners of the package board 41. Therefore, the fastening force of the fastening member 6 is transmitted to the corner of the main body unit 81 through the base plate 71 in the heat sink 7. According to the embodiment, the first leg part 82A is allocated in the corner of the package board 41 to correspond to the corner of the main body unit 81 to which the fastening force of the fastening member 6 is applied. Due to this, the span between the leg parts 82 may be maintained in the direction in which the opposing corners of the package board 41 are connected to each other. As a result, the radius of curvature may be increased (loose) when the main body unit 81 of the heat spreader 8 is bended by the fastening force of the fastening member 6. Therefore, the stress concentration on the metal joint material 45, which is caused by fastening the fastening member 6 after the metal joint material 45 goes solid, may be reduced.

Since the heat spreader 8 has a structure in which the main body unit 81 is prevented from being projected outside the leg part 82 in the corner of the package board 41, the main body unit 81 is prevented from being bended when the main body unit 81 is pressed against the base plate 71. Due to this, the stress concentration on the metal joint material 45 used to join the heat spreader 8 to the semiconductor chip 42 may be reduced. Therefore, even if the heat expansion difference is generated between the semiconductor chip 42 and the heat spreader 8 when the temperature of the semiconductor chip 42 varies every time the power of the electronic apparatus 1 is turned on and off, the joint part between the semiconductor chip 42 and the heat spreader 8 may be prevented from being damaged. Therefore, the reliability at the operation of the semiconductor package 4 may be prevented from decreasing.

Regarding the heat spreader 8 according to the embodiment, the second leg part 82B is allocated inside the first leg part 82A between the chip part 43 and the semiconductor chip 42. Thus, the metal joint material 45 may be prevented from being damaged at the manufacture of the semiconductor package 4. Further, since the first leg part 82A is allocated in the corner of the package board 41, the problem caused by decreasing the span between the leg parts 82B may be prevented. That is, the radius of curvature may be increased when the main body unit 81 of the heat spreader 8 is bended by the fastening force of the fastening member 6, and the main body unit 81 is not easily bended if the projection toward the side of the main body unit 81 in the corner of the package board 41 is removed. Accordingly, at the time of the manufacture of the semiconductor package 4, the large stress is prevented from being applied to the metal joint material 45, so that the metal joint material 45 is prevented from being damaged. Therefore, the reliability of quality concerning the semiconductor package 4 may be secured at both the time of manufacture and the time of operation of the semiconductor package 4 according to the embodiment.

In the heat spreader 8 according to the embodiment, the first leg part 82A is allocated between the semiconductor chip 42 and the fastening member 6. Therefore, in the position where the influence obtained by fastening the fastening member 6 is increased, the span between the first leg parts 82A may be efficiently secured. Due to this, the effect for decreasing the stress applied to the metal joint material 45 is further increased. Therefore, the damage of the joint part of the semiconductor chip 42 and the heat spreader 8 may be prevented more preferably.

In the semiconductor package 4 according to the embodiment, allocating the first leg part 82A in the corner of the package board 41 is advantageous as described below. That is, in the periphery part of the package board 41, the surface of the center part in each side may be used as a space in which the chip part 43 is mounted. Due to this, the chip parts 43 may be allocated along the sides (side surfaces) of the semiconductor chip 42 to be opposing to each other.

In this case, the semiconductor chip 42 and the chip part 43 to be mounted on the package board 41 are electrically coupled to each other through, for example, a wiring layer formed on the package board 41. According to the embodiment, on the surface of the package board 41, the chip parts 43 may be allocated along the sides of the semiconductor chip 42 to be opposing to each other. This may prevent the above-described wiring layer from being formed in a complicated shape. That is, the wiring distance on the wiring layer of the package board 41 may be shortened, and the shape of the wiring pattern forming the wiring layer may be simplified. This makes it possible to reduce the manufacturing cost of the semiconductor package 4 and to improve the reliability of the product.

[Verification]

Figure 15:
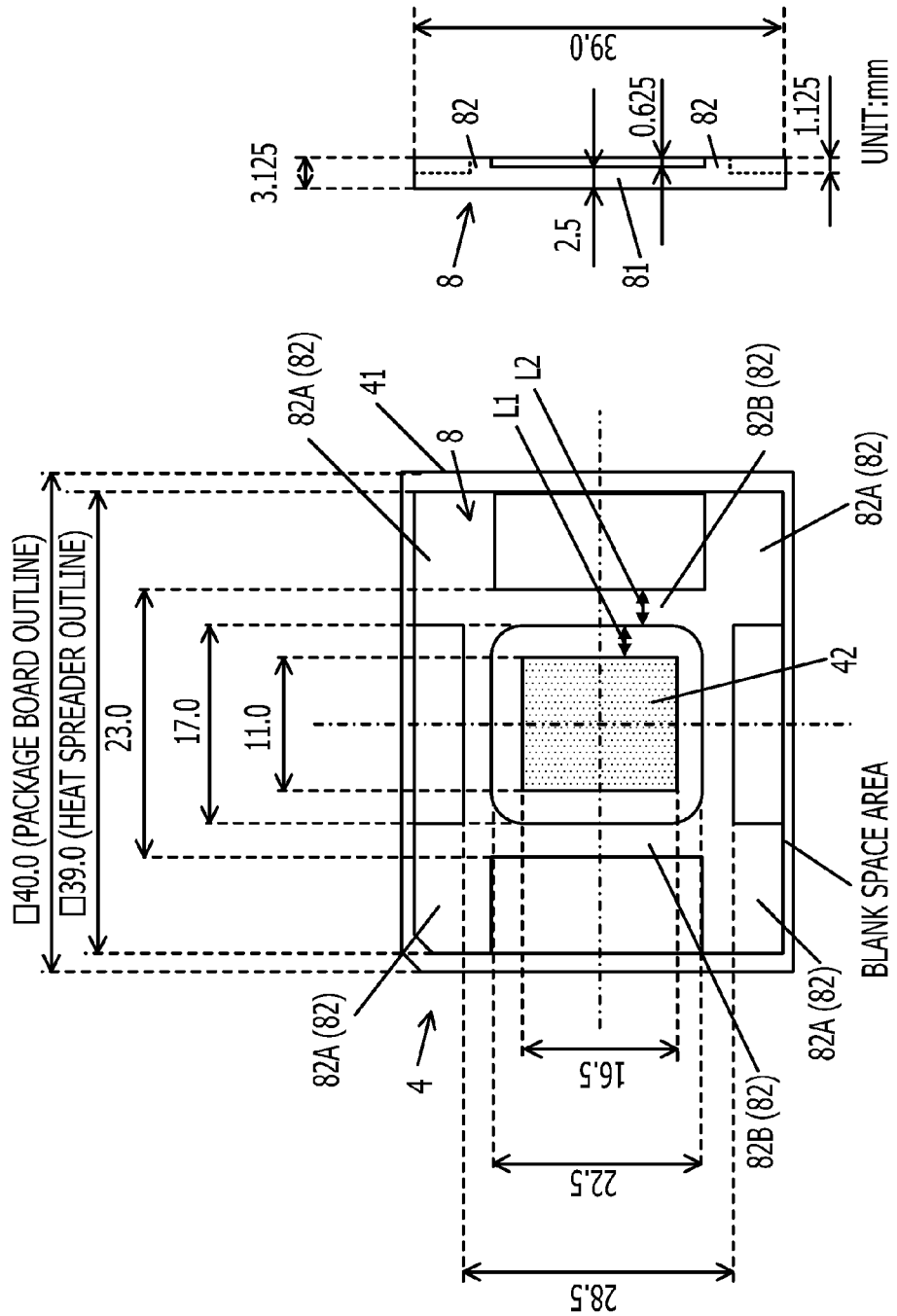
FIG. 15 is an explanation diagram illustrating the semiconductor package according to the first embodiment used for verification.

Regarding the wiring board unit 2 (the semiconductor package 4) according to the first embodiment, verification of reducing effect of the stress applied to the metal joint material 45 was performed. FIG. 15 illustrates the details of the semiconductor package 4 that performed the verification. FIG. 15 is an explanation illustrating the semiconductor package 4 according to the first embodiment used for the verification. The left diagram in FIG. 15 illustrates the plane surface shape and the size of the semiconductor package 4 according to the first embodiment. The right diagram in FIG. 15 illustrates the elevation surface shape and the size of the heat spreader 8 according to the first embodiment. Regarding the semiconductor chip 42 according to the first embodiment used for the verification, the size of the semiconductor chip 42 is 16.5 mm long and 11.0 mm wide, and the size of the package board 41 is 40.0 mm long and 40.0 mm wide.

As for the size of the leg part 82 of the heat spreader 8, the size of the first leg part 82A is 8.25 mm long and 11.0 mm wide. The second leg part 82B is 3.0 mm wide (L2) and is annularly allocated in a square shape. The distance (L1) between each side (each side surface) of the semiconductor chip 42 and the second leg part 82B is 3.0 mm. A blank space area that is 0.5 mm wide corresponding to the outline of the package board 41 is provided around the heat spreader 8. The total height of the heat spreader 8 is 3.125 mm. In the main body unit 81, the thickness of the projection outside the second leg part 82B is 2.0 mm, and the thickness of the projection inside the second leg part 82A is 2.5 mm.

In the verification, the semiconductor package 22 (see FIGS. 1 and 2, and the like) according to the first mode of the comparison example and the semiconductor package 22 (see FIGS. 5 and 6, and the like) according to the second mode of the comparison example are used as a target of comparison to the semiconductor package 4 according to the first embodiment. Hereinafter, the semiconductor package 22 according to the first mode is referred to as "comparison example 1," and the semiconductor package 22 according to the second embodiment is referred to as "comparison example 2." The shape and the size of the semiconductor chip and the package board according to the comparison example 1 and the comparison example 2 respectively are equivalent to the first embodiment.

In the heat spreader according to the comparison example 1, the leg part, which is 3.0 mm wide, is allocated to be formed in a square shape. In the heat spreader according to the comparison example 2, the leg part, which is 3.0 mm wide, is allocated to be formed in a square shape in such a way that the projection of which the width in the short side direction (vertical direction) of the main body unit is 11.0 mm and the width in the long side direction (horizontal direction) of the main body unit is 8.25 mm.

After the above-described verification is conducted under the above-described condition, according to the first embodiment, the results indicate that the stress applied to the metal joint material used to joint the semiconductor chip to the heat spreader is decreased by 21.5 percent compared to the comparison example 1 and by 11.9 percent compared to the comparison example 2.

[Deformation Example]

Figure 16:
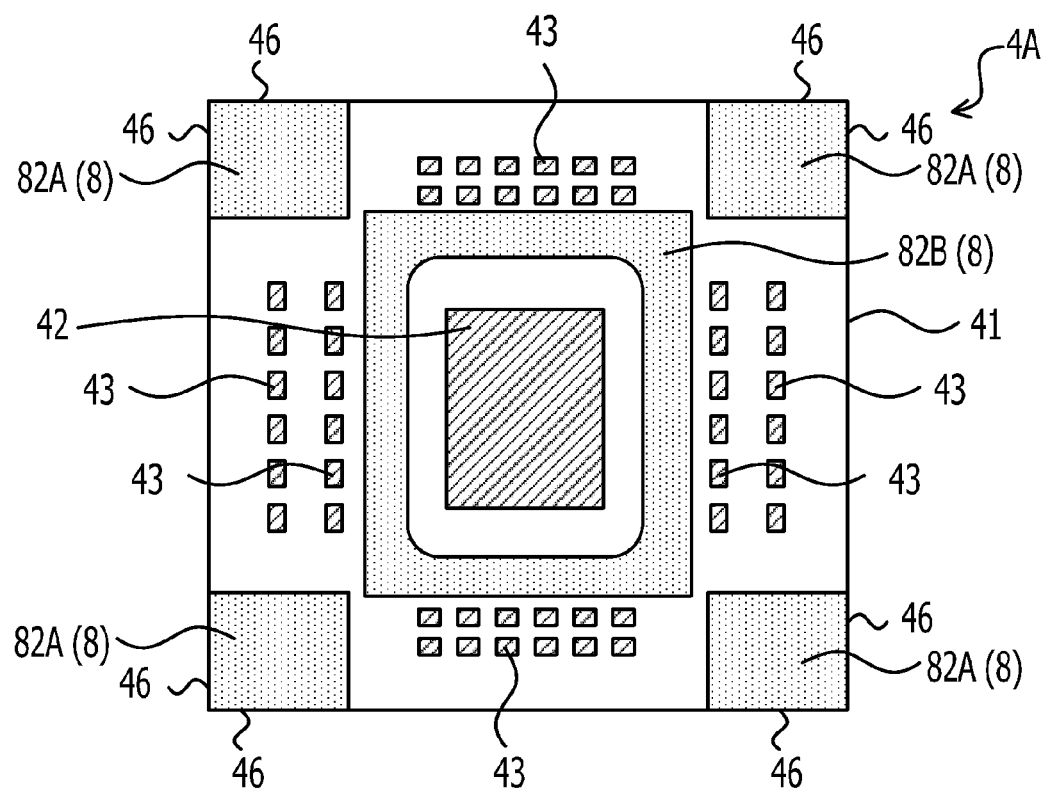
FIG. 16 is an explanation diagram illustrating the semiconductor package according to a first deformation example.

A deformation example according to the embodiment will be described below. FIG. 16 is an explanation diagram illustrating a semiconductor package 4A according to the first deformation example. The components equivalent to the first embodiment are indicated with the similar numerals, so that description thereof is omitted.

According to the first embodiment, the structure for integrally coupling the first leg part 82A to the second leg part 82B of the heat spreader 8 is described as an example. However, the embodiments are not limited to the example. The heat spreader 8 according to the first deformation example includes the first leg part 82A and the second leg part 82B that are independently provided. More specifically, in the first deformation example, the second leg part 82B is formed as a wall body formed roughly in a square shape independently from the first leg part 82A. The first leg parts 82A formed in a rectangle are allocated in the four corners of the package board 41 independently from the second leg part 82B outside the second leg part 82B.

As described above, although the first leg part 82A and the second leg part 82B are apart from each other, the first leg part 82A and the second leg part 82B function as described in the first embodiment. This may prevent the metal joint material, which is used to joint the semiconductor chip 42 to the heat spreader 8, from being damaged. The first leg part 82A and the second leg part 82B are coupled to each other through the main body unit 81 and formed as a single heat spreader 8 as a whole.

Further, regarding the semiconductor package 4A according to the first deformation example, the area in which the first leg part 82A is allocated in the heat spreader 8 includes an outer edge part 46 of the package board 41. That is, among the corners of the package board 41, the first leg part 82A of the heat spreader 8 is allocated in the upper part of the outer edge part 46 forming the outline of the package board 41. In the plane surface direction of the package board 41, when the first leg part 82A of the heat spreader 8 is formed to reach the outer edge part 46 of the package board 41, the resistance force corresponding to the bending of the heat spreader 8 caused by fastening the fastening member 6 is further increased. This is because the radius of curvature, which is obtained when the main body unit 81 of the heat spreader 8 is bended by fastening the fastening member 6 if the span between the first leg parts 82A in the heat spreader is increased, may be increased. In the semiconductor package 4A according to the deformation example, the area in which the first leg part 82A of the heat spreader 8 is allocated includes the outer edge part 46 of the package board 41. This may further prevent the metal joint material 45 from being damaged.

Figure 17:
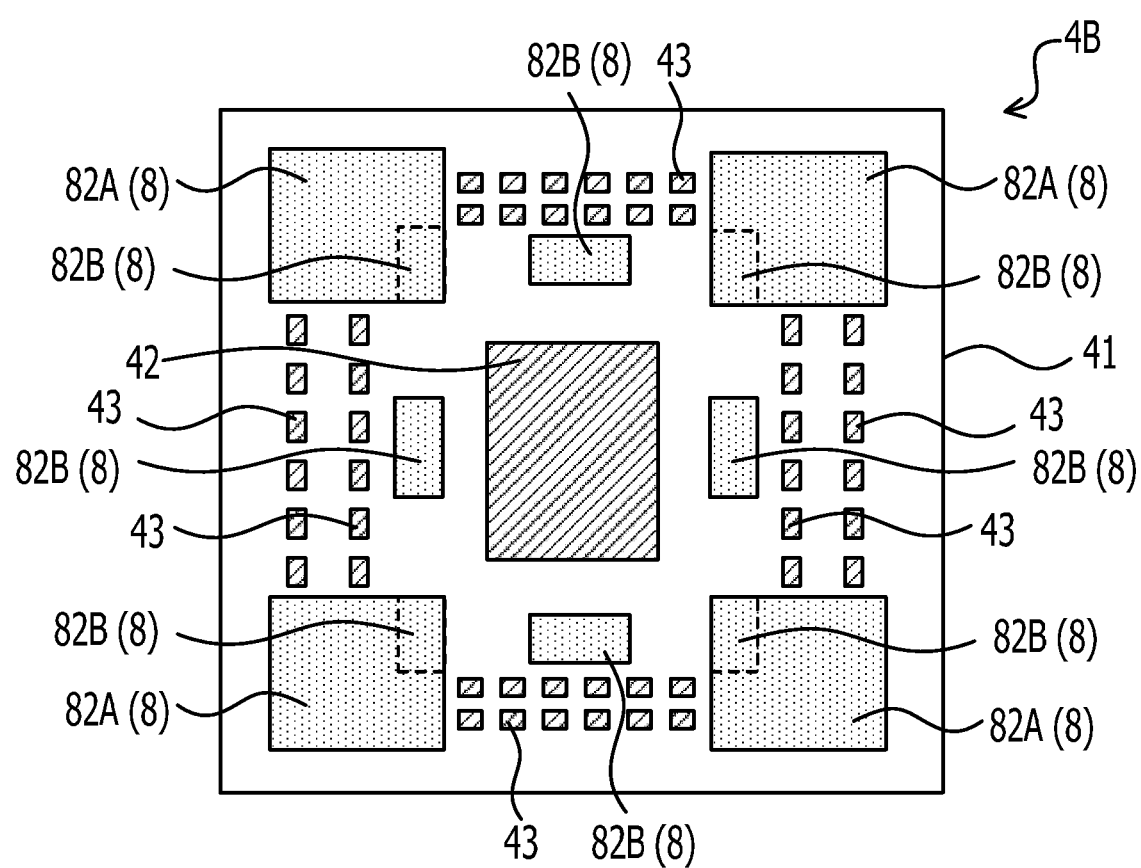
FIG. 17 is an explanation diagram illustrating the semiconductor package according to a second deformation example.

FIG. 17 is an explanation diagram illustrating a semiconductor package 4B according to the second deformation example. The components equivalent to the first embodiment are indicated with the similar numerals, so that description thereof is omitted. As illustrated in FIG. 17, regarding the semiconductor package 4B according to the second deformation example, the shape of the second leg part 2B of the heat spreader 8 is different from the shape of the second leg part 2B of the heat spreader 8 according to the first embodiment. As illustrated in FIG. 17, the second leg part 82B according to the second deformation example has a plurality of column-shaped bodies. As illustrated in FIG. 17, the second leg part 82B of the heat spreader 8 is not typically provided in a circular shape. That is, regarding the package board 41, the area of the semiconductor chip 42 and the area of the chip part 43 are not typically divided by the second leg part 82B.

If the second leg part 82B of the heat spreader 8 is allocated between the chip part 43 and the semiconductor chip 42 inside the first leg part 82A, the stress concentration on the metal joint material 45 may be reduced at the time of manufacture and operation of the semiconductor package 4B. The heat spreader 8 is easily bended when the fastening member 6 is fastened because the second leg part 82B is provided inside the package board 41. This problem may be solved by the operation of the first leg part 82A as described in the first embodiment. In the deformation example, the number of column-shaped bodies to be allocated to form the second leg part 82B is not limited to the example illustrated in FIG. 17 and is variable if desired.

Figure 18:
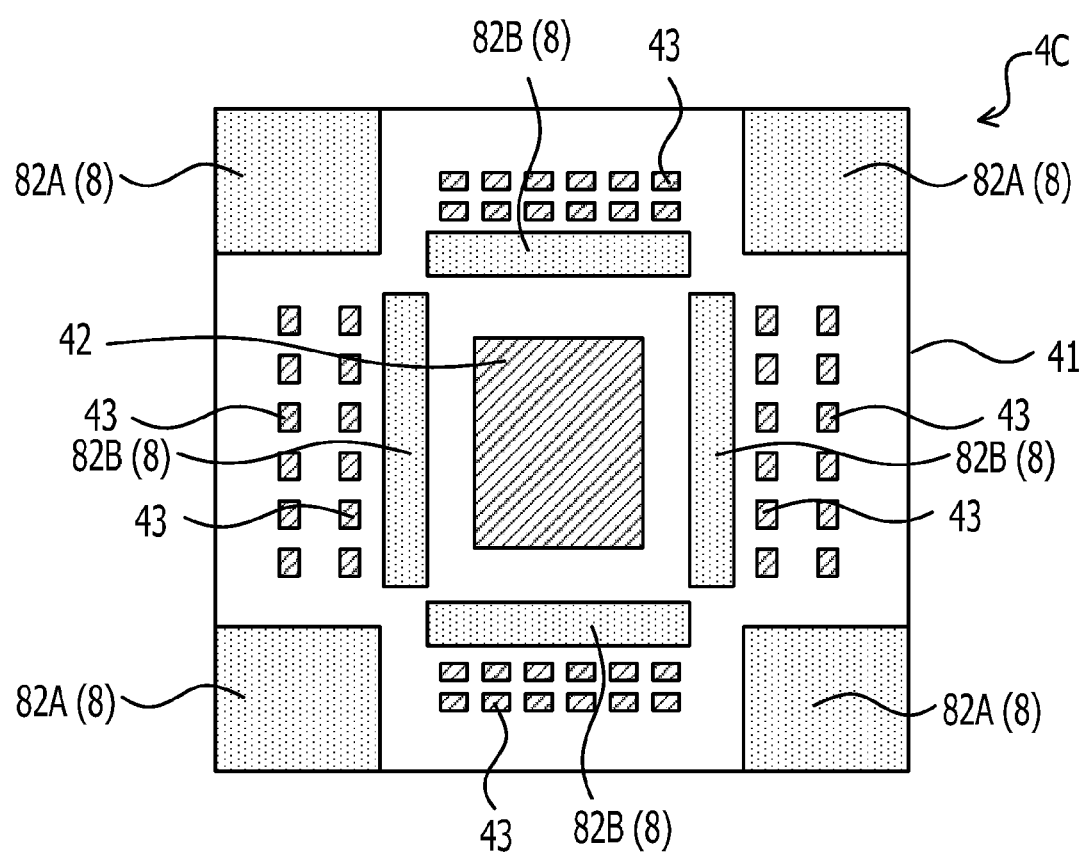
FIG. 18 is an explanation diagram illustrating the semiconductor package according to a third deformation example.

FIG. 18 is an explanation diagram illustrating a semiconductor package 4C according to the third deformation example. Regarding the components equivalent to the above-described structure example are indicated with the similar numerals, so that description thereof is omitted. As illustrated in FIG. 18, the semiconductor package 4C according to the third deformation example includes a wall body formed along the outline of the semiconductor chip 42. More specifically, four wall bodies are allocated to be opposing to the sides (surfaces) of the semiconductor chip 42. Each of the wall bodies forming the second leg part 82B of the heat spreader 8 is provided to shield a space between the chip part 43 and the semiconductor chip 42 provided to be opposing to the side surface of the semiconductor chip 42.

If the semiconductor package 4C is heated in the joint procedure, the solder may flow into the chip part 43 when the solder forming the metal joint material 45 is melted. Therefore, in the semiconductor package 4C according to the present deformation example, the second leg part 82B of the heat spreader 8 is provided to shield the space between the chip part 43 and the semiconductor chip 42. Accordingly, even if the solder forming the metal joint material 45 in the melting state flows into the chip part 43, the solder does not reach the chip part 43 as the space between the chip part 43 and the semiconductor chip 42 is shielded by the second leg part 82B. This may prevent the terminal of the chip part 43 from shorting out due to the melted solder.

The preventing effect of short out error concerning the chip part 43 may be obtained in the semiconductor package 4 according to the first embodiment in which the second leg part 82B of the heat spreader is formed in a circular shape. Further, the second leg part 82B of the heat spreader 8 is allocated to be formed in a circular shape, so that no space is provided between the semiconductor chip 42 and the chip part 43. Thus, the short-out failure of the chip part 43 may be more securely prevented. Therefore, the reliability of the performance and quality concerning the electronic apparatus 1 may be increased.

Regarding the wiring board unit 2 according to the first embodiment, the example indicating that the number of the fastening members 6 to be allocated is four is illustrated. However, the number of the fastening members 6 may be any number other than four. For example, if the number of the fastening members 6 is equal to or smaller than three, the fastening member 6 may not be allocated in any corner of the main board 3. In this case, regarding the corners of the package board 41, the first leg part 82A of the heat spreader 8 is not generally allocated in the position corresponding to the corner of the main board 3 in which the fastening member 6 is not allocated. Regardless of presence of the fastening member 6, the first leg part 82A of the heat spreader 8 may be allocated in the corner of the package board 41.

According to the first embodiment, the structure for coupling the semiconductor package 4 to the main board 3 is the BGA mounting method, an LGA mounting method. A PGA mounting method, or the like may be employed instead of the BGA mounting method. In the embodiments, a personal computer is given as an example of the electronic apparatus. However, the embodiments are not limited to the example. The semiconductor package and the wiring board unit according to the embodiments may be applied to other electronic apparatuses such as a server computer, for example. The above-described embodiments are applicable to combinations of the above-described electronic apparatuses.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor package which is allocated between a wiring board and a cooling member, the semiconductor package, comprising:
    a package board;
    a heating element which is mounted on the package board;
    a chip part which is mounted on the package board and provided around the heating element; and
    a heat transfer element having a main body unit which is jointed to the heating element with a metal joint material and a leg part which extends from the main body part to the package board and of which a tip is attached to the package board, and
    wherein the leg part, comprising:
    a first leg part allocated in a corner of the package board; and
    a second leg part which is allocated inside the first leg part between the heating element and the chip part on the package board,
    wherein the semiconductor package is sandwiched between the wiring board and the cooling member by a fastening member allocated outside an outline of the semiconductor package, and
    wherein the first leg part is allocated between the heating element and the fastening member.

2. The semiconductor package according to claim 1, wherein the second leg part is formed along the outline of the heating element.

3. The semiconductor package according to claim 2, wherein the second leg part is formed in a circular shape.

4. The semiconductor package according to claim 1, wherein an area in which the first leg part is allocated on the package board includes an outer edge part of the package board.

5. A wiring board unit, comprising:
    a first plate;
    a wiring board allocated on the first plate;
    a semiconductor package which is mounted on a surface of the wiring board;
    a cooling member which is allocated on a semiconductor package and includes a second plate with an outline extending outside the semiconductor package; and
    a fastening member which is allocated outside the outline of the semiconductor package and applies a pressure force to the first plate and a second plate in such a way that a space between the first plate and the second plate is narrowed,
    wherein the semiconductor package, comprising:
    a package board;
    a heating element which is mounted on the package board;
    a chip part which is mounted on the package board to be provided around the heating element; and
    a heat transfer element having a main body unit which is jointed to the heating element with a metal joint material and a leg part which extends from the main body unit to the package board and of which a tip is attached to the package board, and
    wherein the leg part, comprising:
    a first leg part which is allocated in a corner of the package board; and
    a second leg part which is allocated inside the first leg part between the heating element and the chip part on the package board.

6. The wiring board unit according to claim 5, wherein the first leg part is allocated between the heating element and the fastening member.

7. The wiring board unit according to claim 5, wherein the second leg part is formed along the outline of the heating element.

8. The wiring board unit according to claim 7, wherein the second leg part is formed in a circular shape.

9. The wiring board unit according to claim 5, wherein an area in which the first leg part is allocated on the package board includes the outer edge part of the package board.

10. An electronic apparatus which comprises a wiring board unit, wherein the wiring board unit, comprising:
- a first plate;
- a wiring board which is allocated on the first plate;
- a semiconductor package which is mounted on a surface of the wiring board;
- a cooling member which is allocated on the semiconductor package and includes a second plate with an outline extending outside the semiconductor package; and
- a fastening member which is allocated outside the outline of the semiconductor package and applies a pressure force to the first plate and a second plate in such a way that a space between the first plate and the second plate is narrowed, wherein the semiconductor package, comprising:
- a package board;
- a heating element which is mounted on the package board;
- a chip part which is mounted on the package board to be provided around the heating element; and
- a heat transfer element having a main body unit which is jointed to the heating element with a metal joint material and a leg part which extends from the main body unit to the package board and of which a tip is attached to the package board, and wherein the leg part, comprising:
- a first leg part which is allocated in a corner of the package board; and
- a second leg part which is allocated inside the first leg part between the heating element and the chip part on the package board.

* * * * *